United States Patent [19]

Bauer et al.

[11] 3,765,898

[45] Oct. 16, 1973

[54] PHOTOPOLYMERIZABLE COPYING COMPOSITION AND COPYING MATERIAL PRODUCED THEREWITH

[75] Inventors: Sigrid Bauer, Hahn/Taunus; Richard Brahm, Wiesbaden-Kastel; Roland Dietrich, Wiesbaden-Biebrich, all of Germany

[73] Assignee: Kalle Aktiengesellschaft, Wiesbaden-Biebrich, Germany

[22] Filed: Aug. 9, 1971

[21] Appl. No.: 170,311

[30] Foreign Application Priority Data

Aug. 11, 1970 Germany.................. P 20 39 861.2

[52] U.S. Cl. .................... 96/115 P, 96/33, 96/35.1, 204/159.23

[51] Int. Cl. ............................................ G03c 1/70

[58] Field of Search .................. 96/115 P, 35.1, 33; 204/159.23

[56] References Cited

UNITED STATES PATENTS

| | | | |
|---|---|---|---|
| 3,650,745 | 3/1972 | Hackmann et al. | 96/115 P |
| 3,479,185 | 11/1969 | Chambers | 96/115 P |

*Primary Examiner*—Ronald H. Smith
*Attorney*—James E. Bryan

[57] ABSTRACT

This invention relates to a photopolymerizable copying composition comprising at least one binder, at least one polymerizable compound and, as a photoinitiator at least one compound of the general formula I

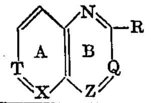

I in which:

Z and Q are different from one another and each represents either a nitrogen atom or the group C-R′, X and T are the same or different and represent a nitrogen atom or the group C-R″, R and R′ are the same or different and represent aliphatic, aromatic or heterocyclic groups and R″ represents hydrogen or an organic group, the nucleus A carrying a further group of the significance of R″ or an annellated benzene ring.

13 Claims, No Drawings

PHOTOPOLYMERIZABLE COPYING COMPOSITION AND COPYING MATERIAL PRODUCED THEREWITH

This invention relates to a photopolymerizable copying composition and copying material produced therewith.

Known photoinitiators for the photopolymerization of unsaturated compounds are, for example, hydrazones, five-membered nitrogen-containing heterocycles, mercapto compounds, pyrylium and thiopyrylium salts, polynuclear quinones, synergistic mixtures of different ketones, and dyestuff/redox systems.

The majority of these compounds have the disadvantage that they are suitable only for specific light-sensitive layers. Their relatively low activity suffices in most cases only for the photo-crosslinkage of unsaturated binders of high molecular weight, for example of polyvinyl cinnamate or the acrylated epoxy resins described in U. S. Pat. No. 3,427,161, but is normally not suitable for the photopolymerization of vinyl compounds of low molecular weight.

Other photoinitiators, for example those mentioned in Netherlands patent application No. 6,715,856, require the addition of suitable sensitizing dyes in order to increase their sensitivity to light. The same holds true for the hydrazones mentioned in German Offenlegungsschrift 1,495,973, which are, moreover, unstable and are therefore not suitable for the production of storable layers.

Others again, for example polynuclear quinones, produce during photopolymerization only a relatively low degree of crosslinkage, so that a differentiation between image and non-image areas is achieved only by employing large amounts of initiator.

The dyestuff/redox system described in U. S. Pat. No. 3,097,096 is suitable only for solutions or in combination with water soluble colloids as binder. The gels formed during exposure to light are not suitable, however, for the production of efficient printing forms, since their density of crosslinkage is too low and their surface is too hydrophilic.

The present invention provides a photopolymerizable copying composition containing at least one binder, at least one polymerizable compound and as a photoinitiator, at least one compound of the general formula I

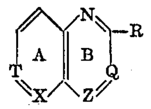

I in which:

Z and Q are different from one another and each represents either a nitrogen atom or the group C-R', X and T are the same or different and represent a nitrogen atom or the group C-R'', R and R' are the same or different and represent aliphatic, aromatic or heterocyclic groups and R'' represents hydrogen or an organic group, the nucleus A carrying a further group of the significance of R'' or an anellated benzene ring.

The latter compounds are a new group of active photoinitiators the initiating activity of which exceeds that of the hitherto known photo-initiators in the spectral region of 300–400 $\mu$.

A further advantage of the photoinitiators of the invention is the fact that they eliminate the addition polymerization of acrylic compounds catalyzed by heat, and therefore produce storable copying layers.

According to the invention, such initiators are preferred as correspond to the general formula II

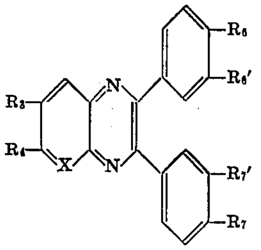

II in which:

X represents a nitrogen atom or the group C-$R_5$, $R_3$, $R_4$ and $R_5$ are the same or different and represent hydrogen or halogen atoms or alkyl, aralkenyl, alkoxy or acrylamino groups or $R_3$ and $R_4$ or $R_4$ and $R_5$ in each case together represent an annelated benzene ring, $R_6$ and $R_7$ are the same or different and represent hydrogen atoms or alkyl or alkoxy groups and $R_6'$ and $R_7'$ are hydrogen atoms or together form with the neighboring substituent $R_6$ or $R_7$ alkylene dioxy groups.

Particularly high sensitivities to light are achieved with such of these initiators, wherein the radicals $R_6$ and $R_7$ are alkoxy groups, particularly methoxy groups.

Also at other positions of the molecule, for example as radicals $R_3$, $R_4$ or $R_5$, alkoxy groups have an advantageous effect.

This effect is particularly surprising because in known photo-initiators, for example in benzophenone and benzil, increase of the initiator action by substitution by alkoxy groups has not been observed.

In industry, the copying composition of the invention may be used in the form of a solution or a dispersion, for example as a so-called photoresist composition, that is applied by the user himself to a particular support, for example for the purpose of etching shaped objects, for the production of printed circuits, of stencils, indicators, screen printing forms and the like, and that is, after drying, exposed to light and developed to an imagewise differentiated layer.

The copying composition may be used especially in the form of a solid photopolymerizable layer on a support as light-sensitive copying material for the production of printing forms, relief images, etching resists, stencils, matrices, screen printing forms, color proofing films, single copies and the like. A primary application is in the production of printing plates, pre-sensitized so as to be storable, for planographic, relief and gravure printing.

The present invention further provides all such copying materials. The majority of the photoinitiators of the invention are known as compounds and are described, for example, in "The Ring Index," second edition, published by the American Chemical Society, Washington. The RRI-number (RRI = Reversed Ring Index) there assigned to each condensed heterocyclic system is given for the purpose of identification in the compilation in Table I below. The ring structures of the compounds used in the Examples below can be seen from the formulae drawings below.

The basic heterocyclic structure of general formula I, consisting of two anellated aromatic rings, may carry up to four substituents and also a further anellated benzene ring.

Suitable substituents in ring A of general formula I are halogen atoms, such as fluorine, chlorine, bromine and iodine, nitro groups, primary, secondary and tertiary amino groups, acylated amino groups, alkyl groups of one to about five carbon atoms, alkoxy groups of one to about five carbon atoms, and aralkenyl radicals of eight to about 12 carbon atoms.

Of these substituents, the more strongly polar, such as nitro-and basic amino groups, are less preferred.

As halogen atoms chlorine and bromine are preferred, as alkyl groups methyl, ethyl and isopropyl groups, as alkoxy groups, methoxy groups and as aralkenyl groups styryl groups. The secondary and tertiary amino groups may be substituted by lower alkyl groups of one to four carbon atoms and by aryl groups, preferably phenyl groups. The acyl groups of the acylamino groups may be derived from aliphatic or aromatic carboxylic or sulfonic acids; preferred are radicals of lower aliphatic and aromatic carboxylic acids, such as acetyl, propionyl and benzoyl radicals.

Ring B carries two substituents in the 1,3- or, preferably, in the 2,3-positions, that are alkyl groups of 1 to about 5 carbon atoms, cycloalkyl groups of five to about eight carbon atoms, aryl groups of six to about 10 carbon atoms or mononuclear five- or six-membered heterocyclic groups. Preferred as alkyl groups are methyl or ethyl groups, as aryl groups substituted or unsubstituted phenyl groups and as heterocyclic groups pyridyl groups. A particularly good initiator action is shown by compounds that carry in the 2,3-positions phenyl groups or particularly p-alkoxyphenyl groups. Such 2,3-diphenyl compounds in which the phenyl groups on two adjacent carbon atoms are substituted by an alkylene dioxy group also have a very good initiator action.

The copying compositions according to the invention contain as essential components binders, liquid and/or solid polymerizable organic compounds and photoinitiators of the type described above. Normally, the initiators are employed in a concentration of 0.01 to 10 percent, based on the weight of the monomer used.

Suitable monomers are, for example, commercial acrylic and methacrylic acid esters and also diglycerol diacrylate, guaiacol glycerol ether diacrylate, neopentyl glycol diacrylate, 2,2-dimethylol-butanol-(3)-diacrylate and acrylates and methacrylates of polyesters, containing hydroxyl groups, of the type of "Desmophen" (commerical product and Registered Trade Mark of Farbenfabriken Bayer, Leverkusen, Germany). Monomers of this kind, and further monomers that are suitable for use in the photopolymer layers of the invention, are described, for example, in U. S. Pat. Nos. 2,760,863 and 3,060,023.

In known manner, the photopolymerizable copying compositions may contain one or more binders, for example solvent-soluble polyamides, polyvinyl acetates, polymethylmethacrylates, polyvinylbutyrals, unsaturated polyesters, alkali-soluble or swellable or softenable styrene/maleic anhydride copolymers, copolymers of methylmethacrylate and N-(p-toluenesulfonyl)-carbamic acid-($\beta$-methacryloxyl)-ethyl ester, maleate resins, terpenephenolic resins and the like. Because development is frequently performed with aqueous-alkaline developers, binders are preferably used that are alkali-soluble or softenable in aqueous alkalies. Examples of such binders are copolymers of styrene with maleic anhydride and of methylmethacrylate with methacrylic acid or the above-named tosylated monomers and also maleate resins.

Dyestuffs, pigments, polymerization inhibitors, color formers and hydrogen donors also may be added to the copying composition. These additions, however, preferably should not absorb excessive amounts of the actinic light required for the initiating process. As is known, substances with aliphatic ether bonds, for example, are suitable as hydrogen donors. In certain cases, the function can be taken over by the binder of the polymerizable substance, so that then additional hydrogen donors can be dispensed with.

The copying compositions are preferably used in the production of relief printing forms, relief images, offset printing forms, bimetal- and also trimetal printing forms, printed circuits, screen printing stencils and printing forms for screenless offset printing.

When the copying composition is stored in liquid form as a so-called photoresist composition and is to be applied to the support only immediately before use, for example to a screen printing base, a conductor plate or the like, the layer components are dissolved or dispersed in a suitable solvent or solvent mixture. As solvents, alcohols, ketones, esters, ethers, amides, hydrocarbons and the like are suitable. The partial ethers of polyhydric alcohols, particularly of glycols, are preferably used.

For the production of printing plates and the like, the solutions or dispersions may be advantageously applied immediately after their preparation to a suitable support and may be stored and marketed as light-sensitive copying materials. For this purpose, the same or similar solvents to those for the production of the photoresist compositions may be used. The application is carried out, for example, by casting, spraying, and the like.

Suitable as layer supports are, for example, zinc, copper, aluminum, steel, polyester or acetate film, "Perlon" gauze, and the like, the surface of which may be subjected to pre-treatment if desired.

When required, an anchorage coating or an antihalation layer may be applied between the support and the light-sensitive layer.

For the production of thick photopolymer layers, the thickness of which may amount to some tenths mm, the copying composition of the invention may be kneaded without being dissolved in a solvent, for example in a three roller mill, and may be applied to the support film by hydraulic pressure of, for example, 30,000–50,000 kg. during one minute at 90° C.

The printing forms, etching resists, screen printing forms, and the like, are produced from suitable materials in a manner customary in practice, i.e., the non-image areas that have remained soluble after exposure through a negative are removed by treatment with suitable solvents or aqueous-alkaline solutions.

Table 1, which follows, presents a number of examples of initiators used, according to the invention. The structural formulae follow Table 1.

TABLE 1

| Compound number | Melting point, ° C. | Formula number | RRI number | Substituents—$R_1=R_2=CH_3=CH=CH—C_6H_5$ | | | | | | |
|---|---|---|---|---|---|---|---|---|---|---|
| | | | | $R_3$ | $R_4$ | $R_5$ | $R_6$ | $R_6'$ | $R_7$ | $R_7'$ |
| 1a | 83-5 | 1 | 1627 | | | | | | | |
| 1b | 190 | 2 | 1627 | | | | | | | |
| 2a | 123-5 | | | H | H | H | H | H | H | H |
| 2b | 103-5 | | | H | H | H | $CH_3$ | H | H | H |
| 2c | 114 | | | $CH_3$ | H | H | H | H | H | H |
| 2d | 153-4 | | | $CH=CHC_6H_5$ | H | H | H | H | H | H |
| 2e | 108 | | | H | H | $CH_3$ | H | H | H | H |
| 2f | 178-9 | | | $CH_3$ | $CH_3$ | H | H | H | H | H |
| 2g | 137 | | | H | H | H | $C_2H_5$ | H | $C_2H_5$ | H |
| 2h | 123-4 | | | H | H | H | $N(CH_3)_2$ | H | H | H |
| 2i | 254-5 | | | $NO_2$ | H | H | H | H | H | H |
| 2k | 170-2 | | | $N(CH_3)_2$ | H | H | H | H | H | H |
| 2l | 118 | | | Cl | H | H | H | H | H | H |
| 2m | 154 | | | $OCH_3$ | H | H | H | H | H | H |
| 2n | 149 | | | H | H | H | $OCH_3$ | H | $OCH_3$ | H |
| 2o | 164 | | | H | H | $CH_3$ | $OCH_3$ | H | $OCH_3$ | H |
| 2p | 117-8 | | | $CH_3$ | H | H | $OCH_3$ | H | $OCH_3$ | H |
| 2q | 114-5 | | | $CH_3$ | $CH_3$ | H | $OCH_3$ | H | $OCH_3$ | H |
| 2r | 150-1 | | | Cl | H | H | $OCH_3$ | H | $OCH_3$ | H |
| 2s | 133 | | | $OCH_3$ | H | H | $OCH_3$ | H | $OCH_3$ | H |
| 2t | 191-2 | | | $NO_2$ | H | H | $OCH_3$ | H | $OCH_3$ | H |
| 2u | 254-5 | | | $NHCOCH_3$ | H | H | H | H | H | H |
| 2v | 223-4 | | | $NHCOCH_3$ | H | H | $OCH_3$ | H | $OCH_3$ | H |
| 2w | 176 | | | $OCH_3$ | H | H | $—O—CH_2—O—$ | | $—O—CH_2—O—$ | |
| 2x | 128 | | | Cl | H | H | $N(CH_3)_2$ | H | H | H |
| 2y | 183-4 | | | H | H | H | $N(CH_3)_2$ | H | Cl | H |

| Compound | Melting point, ° C. | Formula | RRI number | Substituents | |
|---|---|---|---|---|---|
| | ---------- | 3 | 3388 | $R_6$ | $R_7$ |
| 3a | 191 | | | H | H |
| 3b | 186 | | | $OCH_3$ | $OCH_3$ |
| 3c | 179-81 | | | $N(CH_3)_2$ | H |
| | ---------- | 4 | 3393 | | |
| 4a | 144 | | | H | H |
| 4b | 162-3 | | | $OCH_3$ | $OCH_3$ |
| | ---------- | 5 | 1606 | | |
| 5a | 133 | | | H | H |
| 5b | 128-30 | | | $OCH_3$ | $OCH_3$ |
| 6 | 128-30 | 6 | 1607 | $OCH_3$ | $OCH_3$ |
| | ---------- | 7 | ---------- | $R_4$ | |
| 7a | 181-2 | | | H | |
| 7b | 190 | | | Cl | |
| 7c | 128 | | | $OCH_3$ | |
| 8 | 145-7 | 8 | | | |
| | ---------- | 9 | 1626 | $R_8$ | $R_9$ |
| 9a | 130 | | | H | $OCH_3$ |
| 9b | 141-2 | | | $OCH_3$ | $OCH_3$ |
| | ---------- | 10 | 3392 | $R_9$ | |
| 10a | 156-7 | | | H | |
| 10b | 169-70 | | | $N(C_2H_5)_2$ | |

Formula 1

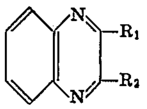

Formula 2

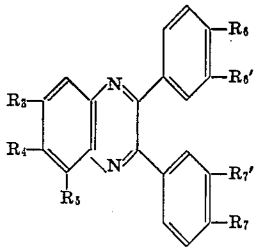

Formula 3

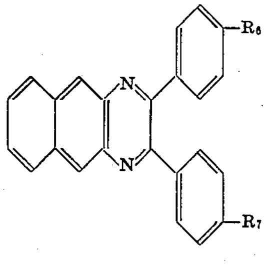

Formula 4

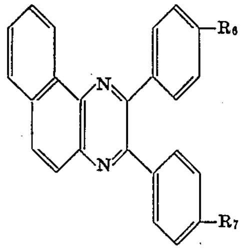

Formula 5

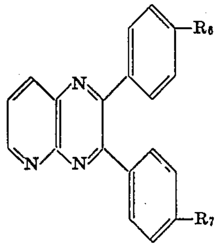

Formula 6

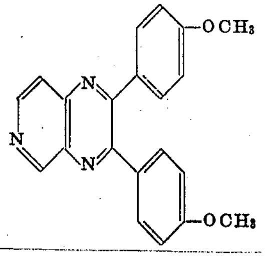

Formula 7

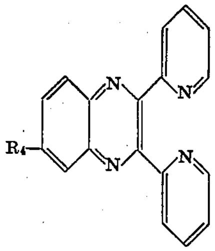

Formula 8

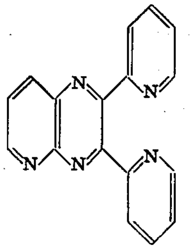

Formula 9

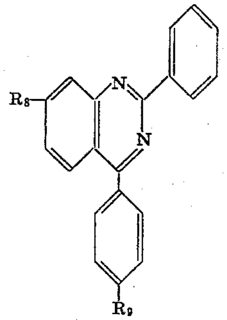

Formula 10

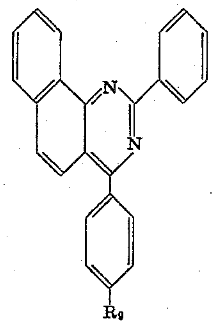

The majority of the compounds presented in Table 1 have been described in the literature. As far as new compounds are concerned, they are produced analogously to the known compounds from the corresponding starting materials. The preparation of the quinoxalines and azaquinoxalines is carried out by condensing the corresponding o-phenylenediamines or 2,3- or 3,4-diaminopyridines, which may be substituted, with equivalent amounts of 1,2-diketones, for example benzil and substituted benzils, in ethanol or glacial acetic acid. Generally, a 10–20 percent solution is employed and refluxing is carried out for several hours. The reaction mixture may be cast into water and the precipitated reaction product recrystallized. The production of the quinazolines is described, for example, in German Patent Specification No. 1,175,086.

The following Examples illustrate the invention; percentages are by weight, unless otherwise stated; the relationship of part by weight to part by volume is that of the gram to the milliliter; (R) means Registered Trade Mark:

EXAMPLE 1

The initiating activity of the photoinitiators is examined in dependence on the composition of the copying layer. The layer formulations used are as indicated in the following Table 2.

TABLE 2

| Components | | Formulation R-I | R-II | R-III | R-IV |
|---|---|---|---|---|---|
| "Lytron"(R)822 | 1) | 1.4 g | | | |
| "Alresat"(R)618 C | 2) | | 1.4 g | | |
| Copolymer A | 3) | | | | 1.4 g |
| Copolymer B | 4) | | | 1.4 g | |
| TMETA | 5) | | | 1.4 g | |
| TMPTA | 6) | 1.3 g | 0.8 g | | 2.0 g |
| 1,6-Dihydroxy-ethoxy-hexane | | 0.2 g | | 0.2 g | 0.4 g |
| Initiator | | 0.05 g | 0.05 g | 0.05 g | 0.05 g |
| Ethylene glycol monomethyl ether | | | | | 23.0 g |
| Ethylene glycol monoethyl ether | | 17.0 g | | 13.0 g | |
| Methylethyl ketone | | | 9.5 g | | |

Comments regarding the trade-names and abbreviations (1–6) used:

1) "Lytron" 822: — Styrene/maleic anhydride copolymer of mean molecular weight 10,000, acid number 190 and softening temperature approximately 190° C., commercial product of Monsanto Chemical Co., St. Louis, U.S.A.

2) "Alresat" 618 C: — Maleate resin of acid number approximately 165 and melting range from 120°–130° C., commercial product of Reichhold-Albert Chemie AG, Weisbaden-Biebrich, Germany.

3) Copolymer A: — Polymer of methylmethacrylate and N-(p-tolylsulfonyl)-carbamic acid-(β-acryloyloxy)-ethyl ester in the weight ratio 60:40, of acid number 60 (see German Patent Application P 20 27 466.2).

4) Copolymer B: — Polymer of methylmethacrylate and methacrylic acid of mean molecular weight 40,000 and acid number 90–115.

5) TMETA: — 1,1,1-Trimethylol-ethane-triacrylate, produced by esterification of trimethylolethane with acrylic acid.

6) TMPTA: — 1,1,1-Trimethylol-propane-triacrylate, commercial product of Sartomer Resins, Inc., Essington, Pa., U.S.A.

For stabilization, TMETA and TMPTA contain 0.02–0.2 percent of inhibitor, for example hydroquinone.

The coating solutions are produced by dissolving the components in the solvent stated and are fed by filtering from any gel portions. They are then applied by whirling to 0.3 mm thick aluminum that has been electrolytically roughened and hardened by anodizing, the oxide layer of which amounts to $3 g/m^2$; the resulting plates are dried for 2 minutes at 100° C. in a drying cupboard. The weight of the dried layer is $5 g/m^2$. The copying layers are then provided with a 1–2 μ thick polyvinyl alcohol coating.

The layers are exposed by means of a 5 kW xenon point source lamp COP XP 5 000 of the firm of Staub, Neu Isenburg, Germany, at a distance of 80 cm between lamp and vacuum copying frame, for 1 minute through a 21-step halftone sensitometric wedge of Eastman Kodak Co., the density range of which is 0.05–3.05, with density increments of 0.15. Thereby, the relative light-sensitivity is determined.

The plates are wiped for 30 seconds to 1 minute, in order to remove the non-image areas, with a developer consisting of 15.0 parts by weight of sodium metasilicate nonahydrate, 3 parts by weight of polyglycol 6,000, 0.6 part by weight of levulinic acid and 0.3 part by weight of strontium hydroxide octahydrate in 1,000 parts by weight of water, and having a pH value of 11.3; the plates are rinsed with water, then fixed with 1 percent phosphoric acid and finally inked up with black greasy ink.

When the copying layers are processed as described above, the fully blackened steps of the Kodak wedge provide a measure of the initiating activity of the compounds examined.

In Tables 3 to 9, the number of steps with maximum blackening is indicated, without taking account of the transitional steps with partial grey toning. The light-sensitivities of two adjacent wedge steps differ by the factor $\sqrt{2}$. The wedge step 0 corresponds to an optical density of 0.05 (instrinsic absorption of the film material).

In the following tests 1–64, the initiating activity is measured, using the formulations R-I to R-IV.

TABLE 3

Formulation: R-I

| Test No. | Compound No. | Wedge steps | Test No. | Compound No. | Wedge steps |
|---|---|---|---|---|---|
| 1 | 5 *b* | 12 | 16 | 2 *f* | 9 |
| 2 | 2 *p* | 11 | 17 | 2 *g* | 9 |
| 3 | 2 *q* | 11 | 18 | 2 *t* | 9 |
| 4 | 2 *r* | 11 | 19 | 3 *a* | 9 |
| 5 | 2 *s* | 11 | 20 | 6 | 9 |
| 6 | 2 *w* | 11 | 21 | 2 *b* | 8 |
| 7 | 2 *m* | 10 | 22 | 2 *c* | 8 |
| 8 | 2 *n* | 10 | 23 | 2 *d* | 8 |

| | | | | | |
|---|---|---|---|---|---|
| 9 | 2 *o* | 10 | 24 | 7 *c* | 8 |
| 10 | 2 *u* | 10 | 25 | 2 *a* | 7 |
| 11 | 2 *v* | 10 | 26 | 2 *e* | 7 |
| 12 | 3 *b* | 10 | 27 | 2 *l* | 7 |
| 13 | 4 *a* | 10 | 28 | 2 *x* | 6 |
| 14 | 4 *b* | 10 | 29 | 8 | 6 |
| 15 | 5 *a* | 10 | 30 | 2 *k* | 5 |

By comparison, under these conditions no image is obtained with the known initiators N-phenyl-thioacridone, 1,3,5-triacetylbenzene, 2-mercapto-benzothiazole and 4,5-di-(p-anisyl)-2-phenyloxazole, the wedge step 0 is obtained with 2,4,6-tri-(p-anisyl)-thiopyrylium perchlorate and 2,4-di-(p-anisyl)-6-phenyl-pyrylium perchlorate and the wedge step 4 with 2-ethylanthraquinone.

TABLE 4

| Test No. | Compound No. | Wedge steps, R-II | obtained with R-IV |
|---|---|---|---|
| 31 | 2 *w* | 2 | 6 |
| 32 | 2 *n* | 8 | 5 |
| 33 | 2 *p* | 2 | 5 |
| 34 | 2 *r* | 4 | 6 |
| 35 | 2 *s* | 9 | 5 |
| 36 | 2 *t* | 3 | 5 |
| 37 | 2 *m* | 6 | 4 |
| 38 | 2 *o* | 2 | 4 |
| 39 | 2 *c* | 1 | 2 |

TABLE 5

Formulation R-III is used, to which is added in all cases 0.02 g of the dyestuff "Supranolblau" GL (C.I. 50,335) in order to color the layer.

| Test No. | Compound No. | Wedge steps | Test No. | Compound No. | Wedge steps |
|---|---|---|---|---|---|
| 40 | 2 *n* | 10 | 53 | 4 *a* | 8 |
| 41 | 2 *p* | 10 | 54 | 5 *a* | 8 |
| 42 | 2 *r* | 10 | 55 | 2 *u* | 7 |
| 43 | 3 *b* | 10 | 56 | 4 *b* | 7 |
| 44 | 5 *b* | 10 | 57 | 6 | 7 |
| 45 | 2 *d* | 9 | 58 | 2 *c* | 6 |
| 46 | 2 *m* | 9 | 59 | 2 *f* | 6 |
| 47 | 2 *o* | 9 | 60 | 3 *a* | 6 |
| 48 | 2 *q* | 9 | 61 | 7 *c* | 6 |
| 49 | 2 *s* | 9 | 62 | 2 *a* | 5 |
| 50 | 2 *w* | 9 | 63 | 2 *l* | 5 |
| 51 | 2 *g* | 8 | 64 | 2 *t* | 4 |
| 52 | 2 *v* | 8 | | | |

By comparison, one wedge step is obtained with the known initiator N-phenyl-thioacridone, two wedge steps are obtained with benzoin methyl ether and three wedge steps with Michler's ketone or 9,10-phenanthrenequinone. Thiopyrylium salts and pyrylium salts provide to be inactive.

Printing form

A coating solution is prepared from 1.1 parts by weight of a reaction product of a polyvinylbutyral ("Mowital" B 60 T of Farbwerke Hoechst, Frankfurt, Germany), and p-toluenesulfonyl isocyanate of acid number 60, 0.1 part by weight of a polyvinylbutyral ("Mowital" B 60 T) of a mean molecular weight 70,000–80,000, 1.1 parts by weight of trimethylolethane triacrylate, 0.1 part by weight of polyoxyethylene lauryl ether, 0.1 part by weight of 6,4',4''-trimethoxy-2,3-diphenyl-quinoxaline, 0.01 part by weight of fuchsin (C.I. 42,510), and 15 parts by weight of ethylene glycol monomethyl ether, and is applied by whirling to a mechanically roughened 0.3 mm thick aluminum sheet to form a layer of a weight of 5 g/m², and is dried for 1 minute at 100° C. in a drying cupboard.

The copying layer is then provided with a 1–2 μ thick polyvinyl alcohol coating and is exposed for 1 minute through a negative as described above. In order to remove the non-image areas, it is treated for 1 minute with the developer described above, rinsed with water, fixed with 1 percent phosphoric acid and gummed, for preservation, with an aqueous gum arabic solution.

The resulting printing form provides in offset printing on a Dualith printing machine at least 100,000 perfect prints.

EXAMPLE 2

The influence of methoxy substituents on the initiating activity of quinoxaline derivatives according to the invention and of ketones known as photoinitiators is demonstrated. When used in formulation R-III of Example 1, the representatives of Formula 2, given in Table 6 below, show the initiator action, expressed in wedge steps, there indicated. The substituents $R_6'$ and $R_7'$ are in all cases hydrogen atoms.

TABLE 6

| Test No. | Compound No. | $R_3$ | $R_4$ | $R_5$ | Wedge Steps $R_6$=$R_7$=H | Wedge Steps $R_6$=$R_7$=$OCH_3$ |
|---|---|---|---|---|---|---|
| 65 | 2 *a* | H | H | H | 5 | |
| 65 *a* | 2 *n* | | | | | 9 |
| 66 | 2 *l* | Cl | H | H | 5 | |
| 66 *a* | 2 *r* | | | | | 10 |
| 67 | 2 *c* | $CH_3$ | H | H | 6 | |
| 67 *a* | 2 *p* | | | | | 10 |
| 68 | 2 *e* | H | H | $CH_3$ | 3 | |
| 68 *a* | 2 *o* | | | | | 9 |
| 69 | 2 *u* | $NHCOCH_3$ | H | H | 7 | |
| 69 *a* | 2 *v* | | | | | 8 |
| 70 | 2 *f* | $CH_3$ | $CH_3$ | H | 6 | |
| 70 *a* | 2 *q* | | | | | 9 |

An increase of the light-sensitivity is also observed with benzoquinoxalines (Formulae 3 and 4) and azaquinoxalines (Formula 5) and holds true also for formation R-I (see wedge step values in Tables 3 and 5).

When the effect of the methoxy substitution on the initiating activity of various ketones, known as photoinitiators, in formulation R-III is examined, the picture represented in Table 7 below emerges. In this case, the exposure is carried out by means of a tube exposure apparatus of the firm of Moll, Solingen-Wald, Germany, that contains 13 fluorescent tubes of the type Philips TL-AK-40 W/05 arranged on a surface 60 × 60 cm. This lamp distance is 7–8 cm, a polyvinyl chloride film is used as cover film. The exposure time is 5 minutes. The xenon point source lamp described in Example 1 is not suitable for this comparison, because its emission in the UV-region of the spectrum is relative low.

TABLE 7

| Test No. | Initiator | Wedge steps | Initiator | Wedge steps |
|---|---|---|---|---|
| 71 | Benzo pheone | 1 | 4,4'-Dimethoxy-benzophenone | 1 |
| 72 | Benzoin | 5 | Anisoin | 5 |
| 73 | Benzil | 1 | Anisil | 1 |

EXAMPLE 3

A coating solution is prepared from 1.4 parts by weight of a polyester, containing hydroxyl groups and esterified with acrylic acid ("Desmophen" 850 of Farbenfabriken Bayer, Leverkusen, Germany), 1.4 parts by weight of a copolymer of methylmethracrylate and methacrylic acid, of a mean molecular weight of 60,000 and an acid number of 93.7, 0.1 part by weight of 6-methoxy-2,3-diphenyl-quinoxaline, 0.2 part by weight of 1,6-di-hydroxyethoxy-hexane.

0.02 part by weight of "Supranolblau" GL (C.I. 50,335) and 13.0 parts by weight of ethylene glycol monoethyl ether and applied by means of a whirler to 0.3 mm thick aluminum that has been electrolytically roughened and hardened by anodizing, as described in Example 1, and is dried. The exposure is then made through a step wedge by means of an 8kW xenon point source lamp, BIKOP, of the firm of Klimsch, Frankfurt, Germany, at a distance of 75 cm, for 1 minute. Development and evaluation are carried out as in Example 1. The number of wedge steps with maximum blackening is 5.

The number of wedge steps is increased to 6 if, instead of the acrylic acid ester described above, the corresponding methacrylic acid ester is used.

The number of wedge steps is 5 if, instead of the acrylic esters mentioned, the same amount of diglycerol diacrylate is employed.

Copying layers of a correspondingly high light-sensitivity cannot be produced with the formulations described above, using the known initiators N-phenyl-thioacridone, benzoin methyl ether, 2-mercapto-benzothiazole, Michler's ketone/xanthone (1:1) and 2-ter.-butyl-anthraquinone.

EXAMPLE 4

A coating solution corresponding to R-I of Example 1 is whirled onto a biaxially stretched polyethylene terephthalate film, of 125 μ thickness, that has been provided with an anchorage layer according to German Auslegeschrift 1,228,414, is dried and also provided with a 1–2 μ thick top coating of polyvinyl alcohol. Exposure and development are carried out as in Example 1.

The initiating activity of various initiators is represented in the following Table:

TABLE 8

| Test No. | Compound No. | Wedge steps |
|---|---|---|
| 74 | 2 *r* | 5 |
| 75 | 3 *a* | 5 |
| 76 | 2 *o* | 3 |
| 77 | 4 *a* | 3 |
| 78 | 5 *a* | 2 |

EXAMPLE 5

In order to produce a zinc relief printing form, a coating solution according to formulation R-III of Example 1 is prepared, containing 0.05 g initiator, and is applied by whirling to a cleaned single-stage zinc etching plate and dried. The layer is then provided with a 1–2 μ thick top coating of polyvinyl alcohol. Exposure and development are then carried out as in Example 1. The relative light-sensitivities with the initiators used, are as follows:

TABLE 9

| Test No. | Initiator No. | Wedge steps |
|---|---|---|
| 79 | 2 *o* | 7 |
| 80 | 2 *p* | 7 |
| 81 | 2 *q* | 7 |
| 82 | 2 *s* | 7 |
| 83 | 3 *b* | 7 |
| 84 | 2 *r* | 6 |
| 85 | 2 *v* | 6 |

For the production of relief printing forms, the uncovered zinc surfaces are etched at room temperature for 6 minutes with 6 percent nitric acid. The forms thus obtained are suitable for high-quality letterpress printing.

EXAMPLE 6

A coating solution is prepared from 4.0 parts by weight of a styrene/maleic anhydride copolymer ("Lytron" 820), 2.0 parts by weight of an α-methylstyrene/vinyltoluene copolymer ("Piccotex" of Pennsylvania Industrial Chemical Corporation, Clairton, Pennsylvania U.S.A.), 0.35 part by weight of a vinylbutyral of a mean molecular weight of 30,000–35,000 ("Mowital" B 20 H of Farbwerke Hoechst, Frankfurt, Germany)

0.25 part by weight of initiator (compounds Nos. 9*a*, 9*b*, 10*a*, 10*b*), 5.0 parts by weight of trimethylolpropane triacrylate, 0.02 part by weight of p-methoxyphenol and 5 parts by volume of methylethyl ketone, and is applied by whirling to a cleaned single-stage zinc etching plate and dried. The layer is then provided with a 1–2 μ thick polyvinyl alcohol coating.

Exposure is then carried out for 1 ½ minutes through a negative as in Example 1, and development is carried out for 2 minutes with a 2 percent aqueous trisodium phosphate solution. For the production of relief printing forms, the freed zinc surfaces of the four test plates are etched at room temperature for 5 minutes with 6 percent nitric acid.

EXAMPLE 7

A coating solution corresponding to Example 6, but containing 0.25 part by weight of the same polyvinylbutyral and 0.25 part by weight of 4-(4-methoxy-phenyl)-2-phenyl-quinazoline (compound No. 9*a*) as initiator is applied by whirling to the copper surface of a support that consists of a plate of plastic material with a thin laminated copper layer, and is dried. The layer is then coated with a 1–2 μ thick polyvinyl alochol coating.

The layer is exposed through the negative of a wiring diagram for 2 ½ minutes by means of the light source stated in Example 1, and is developed for 2 minutes with a 1 percent aqueous trisodium phosphate solution.

The uncovered copper is etched for 30 minutes with a solution of ferric chloride and a printed circuit is obtained.

EXAMPLE 8

A copper/aluminum bimetal plate is pre-treated as follows:

The copper surface freed from preservative is roughened with whitening chalk, degreased with trichloroethylene, freed from its oxide layer by immersing it in 1.5 percent nitric acid (30 seconds) and then pretreated with a solution of 84 ml distilled water and 8 ml of a chromate solution (KENVERT No. 31 of Conversion Chemical Corporation, Rockville, Conn./U.S.A.) for 1 minute.

The coating solution R-I prepared according to Example 1 containing 0.05 g of 4′, 4″-dimethoxy-2,3-diphenyl-quinoxaline, is whirled onto the prepared surface and then dried. The copying layer is provided with a 1–2 μ thick coating of polyvinyl alcohol.

Exposure and development are carried out as in Example 1. The number of the wedge steps producing an image is 6.

In order to produce a Cu/Al bimetal offset printing plate, the copper uncovered after development is etched within 2.5 to 3 minutes with a ferric chloride etch ("400 Series" ALC Etch, Type LS 402, of Fred K. H. Levey Co., Inc., New York). The plate is then wiped with 1 percent phosphoric acid and inked up with greasy ink.

EXAMPLE 9

A coating solution is prepared from 1.4 parts by weight of the polyester modified with methacrylic acid, described in Example 3, 1.4 parts by weight of a methylmethacrylate/methacrylic acid copolymer of a mean molecular weight of 40,000 and an acid number of 125.

0.05 part by weight of 6-chloro-4',4''-dimethoxy-2,3-diphenylquinoxaline, 0.2 part by weight of 1,6-di-hydroxyethoxy-hexane, 0.02 part by weight of "Supranolblau" GL (C.I. 50 335) and 8.0 parts by weight of methylethyl ketone and applied to a monofil "Perlon" fabric having 120 threads/cm, and dried. It is exposed as in Example 1 for 3 minutes through a positive and developed as there described.

The stencil thus obtained may be used for screen printing. It is distinguished by high abrasion resistance and excellent definition of outlines. Instead of the fabric of plastic material, silk, metal fabric, or glass fibers may be coated.

EXAMPLE 10

For the production of color proofing films, four coating solutions according to formulation R-I of Example 1 are prepared, each containing 0.05 g of 4',4''-dimethoxy-2,3-diphenyl-quinoxaline and 20 g of ethylene glycol monoethyl ether, and each is colored with one of the following dyestuffs:

a. Yellow film: 0.08 g "Fettgelb" 3 G (C.I. 12 700), b. Red film: 0.04 g "Zaponechtrot" BE (C.I. 12 715) and 0.04 g "Zaponechtrot" BB (C.I. Solvent Red 71), c. Blue film: 0.08 g "Supranolblau" GL (C.I. 50 335), d. Black film: 0.08 g "Fettschwarz" HB (C.I. 26 150)

These solutions are whirled onto biaxially stretched polyethylene terephthalate film of 180 μ thickness and dried for two minutes at 100° C. The layers are then provided with a 1–2 μ thick coating of polyvinyl alcohol and exposed as in Example 1 through the corresponding color separation silver films (blue film 30 seconds, red film 1 minute, yellow film 4 minutes and black film 6 minutes). The development is carried out as in Example 1.

When the component color images are superimposed, a color-correct reproduction of the original, from which the color separation silver films derive, is formed.

EXAMPLE 11

A coating solution is prepared from 2.9 parts by weight trimethylolethane triacrylate, 4.9 parts by weight of the methylmethacrylate/methacrylic acid copolymer used in Example 9, 0.3 part by weight of 6,4',4''-trimethoxy-2,3-diphenyl-quinoxaline and 10.0 parts by weight of methylethyl ketone, and cast onto a 0.3 mm thick aluminum sheet, the edges of which are bent at an angle of 90°, and the solvent is slowly evaporated by leaving to stand. Further drying is carried out for 1 hour at 100° C. The resulting 0.6 mm thick polymer layer is then exposed through a photographic negative for 15 minutes to the light source described in Example 3, at a distance of 75 cm, and is developed for 15 minutes in a rocking bath with the developer described in Example 1.

A firmly adhering relief image, toned light yellow, suitable after removal of the edges for relief printing or letterset printing, is obtained.

EXAMPLE 12

A coating solution is prepared according to formulation R-III of Example 1 and containing 0.05 g of 6,7-dimethyl-4',4''-dimethoxy-2,3-diphenyl-quinoxaline as an initiator and is whirled onto an aluminum/copper/chromium trimetal plate and dried. The copying layer is then coated with a 1–2 μ thick protective layer of polyvinyl alcohol and exposed through a positive for 30 seconds to the light source indicated in Example 1, and is developed as in Example 1. The uncovered chromium is then etched within 7 minutes with a solution of 17.4 percent $CaCl_2$, 35.3 percent $ZnCl_2$, 2.1 percent HCl and 45.2 percent water and the hardened photopolymer layer is removed with methylene chloride. The plate is then wiped with 1 percent phosphoric acid and inked up with greasy ink. The trimetal plate is then ready for printing.

EXAMPLE 13

A coating solution is prepared from 1.0 part by weight of a reaction product of a polyvinylbutyral ("Mowital" B 20 T) and p-toluenesulfonyl isocyanate, of acid number 60, 0.1 part by weight of a polyvinylbutyral ("Mowital" B 60 T) of a mean molecular weight of 70,000–80,000, 0.2 part by weight of methylmethacrylate/methacrylic acid copolymer of a mean molecular weight of 40,000 and acid number 60, 2.0 parts by weight of trimethylolpropane triacrylate, 0.4 part by weight of 1,6-di-hydroxyethoxy-hexane, 0.1 part by weight of p-dimethylamine-benzal acetone, 0.05 part by weight of "Supranolblau" GL (C.I. 50 335) and 31.0 parts by weight of ethylene glycol monoethyl ether and is applied by whirling to aluminum of 0.3 mm thickness that has been electrolytically roughened, and also hardened by anodizing, as described in Example 1, and is dried. The copying layer is then coated with a 1–2 μ thick coating of polyvinyl alcohol and exposed according to Example 1, in one case through a step wedge, and in a second case through a photographic halftone transparency for 50 seconds. The development is carried out as in Example 1.

The soft working layer reproduces the wedge steps 1 to 10 in gradual transition from dark to light and thus permits the production of a reproduction true to the original of the silver film transparency.

EXAMPLE 14

A coating solution is prepared according to formulation R-III of Example 1 with 0.05 g of 6,4',4''-trimethoxy-2,3-diphenyl-quinoxaline as an initiator and is whirled onto a chromium-coated aluminum support, the chromium surface of which is hydrophilic, and is dried. The copying layer is then provided with a 1–2 μ thick protective layer of polyvinyl alcohol. Exposure (3 minutes), development, and fixing are carried out as in Example 1.

The resulting printing form provides in offset printing on a commerical printing machine at least 100,000 perfect prints.

It will be obvious to those skilled in the art that many modifications may be made within the scope of the present invention without departing from the spirit thereof, and the invention includes all such modifications.

What is claimed is:

1. A photopolymerizable copying composition comprising at least one binder, at least one polymerizable compound and, as a photoinitiator, at least one compound of the general formula I

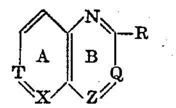

I in which

Z and Q are different from one another and each represents either a nitrogen atom or the group of C-R', X and T represent a nitrogen atom or the group C-R'', not more than one of them being nitrogen, R and R' are the same or different and represent alkyl groups having one to five carbon atoms, styryl groups, phenyl groups either unsubstituted or substituted by chlorine atoms or alkyl, alkoxy, alkylenedioxy or amino groups, or mononuclear 6-membered heterocyclic groups, and R'' represents hydrogen, halogen, a nitro group, an amino group, an acylated amino group, an alkyl group having one to five carbon atoms, an alkoxy group having one to five carbon atoms or an aralkenyl group having eight to 12 carbon atoms, the nucleus A carrying a further group of the significance of R'' or an annellated benzene ring.

2. A copying composition as claimed in claim 1, in which the photoinitiator is a compound of the general formula II

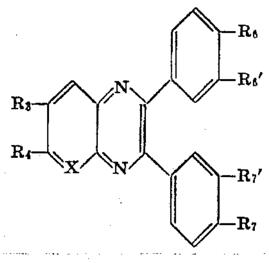

II in which:

X represents a nitrogen atom or the group C-$R_5$, $R_3$, $R_4$ and $R_5$ are the same or different and represent hydrogen or halogen atoms or alkyl, aralkenyl, alkoxy or acylamino groups or $R_3$ and $R_4$ or $R_4$ and $R_5$ in each case together represent an anelated benzene ring, $R_6$ and $R_7$ are the same or different and represent hydrogen atoms or alkyl or alkoxy groups and $R_6'$ and $R_7'$ are hydrogen atoms or together form with the neighboring substituent $R_6$ or $R_7$ alkylene dioxy groups.

3. A copying composition as claimed in claim 2, in which the photoinitiator is a compound in which $R_6$ and $R_7$ are alkoxy groups.

4. A copying composition as claimed in claim 3, in which the alkoxy groups are methoxy groups.

5. A copying composition as claimed in claim 4, in which the photoinitiator is 4',4''-dimethoxy-2,3-diphenyl-quinoxaline.

6. A copying composition as claimed in claim 4, in which the photoinitiator is 6-methyl-4',4''-dimethoxy-2,3-diphenyl-quinoxaline.

7. A copying composition as claimed in claim 4, in which the photoinitiator is 6,7-dimethyl-4',4''-dimethoxy-2,3-diphenyl-quinoxaline.

8. A copying composition as claimed in claim 4, in which the photoinitiator is 6-chloro-4',4''-dimethoxy-2,3-diphenyl-quinoxaline.

9. A copying composition as claimed in claim 4, in which the photoinitiator is 6,4',4''-trimethoxy-2,3-diphenyl-quinoxaline.

10. A copying composition as claimed in claim 4, in which the photoinitiator is 4',4''-dimethoxy-2,3-diphenyl-5-aza-quinoxaline.

11. A copying composition as claimed in claim 1, in which the binder is soluble or softenable in aqueous alkali.

12. A copying composition as claimed in claim 1, additionally containing at least one hydrogen donor.

13. A copying composition as claimed in claim 1 in the form of a light-sensitive layer on a support.

* * * * *

UNITED STATES PATENT OFFICE
CERTIFICATE OF CORRECTION

Patent No. 3,765,898 Dated October 16, 1973

Inventor(s) Sigrid Bauer et al

It is certified that error appears in the above-identified patent and that said Letters Patent are hereby corrected as shown below:

Column 1, line 3 from the bottom, "300-400" should read --- 300-450 ---.

Column 4, line 2, "(β-methacryloxyl)" should read --- (β-methacryloxy) ---

Columns 5 and 6, line 1 of Table 1, the portion "Substituents— $R_1=R_2=CH_3=CH=CH—C_6H_5$" should read ---

Substituents $R_1 = R_2 = CH_3$ $= CH === CH - C_6H_5$ ---.

Column 7, line 41, "1,175,086" should read --- 1,175,076 ---.

Column 9, line 49, "provide" should read --- prove ---.

Column 10, line 38, "formation" should read --- formulation ---. Line 53, "relative" should read --- relatively ---.

Column 15, line 34, "of" is to be deleted.

Signed and sealed this 5th day of March 1974.

(SEAL)
Attest:

EDWARD M. FLETCHER, JR.
Attesting Officer

C. MARSHALL DANN
Commissioner of Patents